United States Patent
Chudzik et al.

(10) Patent No.: US 9,059,211 B2
(45) Date of Patent: Jun. 16, 2015

(54) OXYGEN SCAVENGING SPACER FOR A GATE ELECTRODE

(75) Inventors: Michael P. Chudzik, Danbury, CT (US); Deleep R. Nair, Fishkill, NY (US); Vijay Narayanan, New York, NY (US); Carl J. Radens, LaGrangeville, NY (US); Jay M. Shah, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 13/251,471

(22) Filed: Oct. 3, 2011

(65) Prior Publication Data

US 2013/0082337 A1    Apr. 4, 2013

(51) Int. Cl.
| | |
|---|---|
| *H01L 21/02* | (2006.01) |
| *H01L 29/66* | (2006.01) |
| *H01L 29/51* | (2006.01) |
| *H01L 21/28* | (2006.01) |
| *H01L 21/283* | (2006.01) |

(Continued)

(52) U.S. Cl.
CPC ........ *H01L 29/66575* (2013.01); *H01L 29/517* (2013.01); *H01L 29/665* (2013.01); *H01L 29/6653* (2013.01); *H01L 29/6656* (2013.01); *H01L 29/6659* (2013.01); *H01L 29/78* (2013.01); *H01L 21/823864* (2013.01); *H01L 21/28017* (2013.01); *H01L 21/283* (2013.01)

(58) Field of Classification Search
CPC .................. H01L 21/02214; H01L 21/02216; H01L 21/8238; H01L 27/0922; H01L 27/11807; H01L 2027/11807; H01L 21/76897; H01L 21/8224; H01L 21/8228; H01L 21/8234; H01L 21/823885; H01L 29/08
USPC ........... 257/410, 369, 411; 438/199, 287, 216
See application file for complete search history.

(56) References Cited

U.S. PATENT DOCUMENTS

| | | | |
|---|---|---|---|
| 6,949,481 B1 * | 9/2005 | Halliyal et al. | ............... 438/795 |
| 7,226,831 B1 | 6/2007 | Metz et al. | |
| 7,768,079 B2 | 8/2010 | Sandford et al. | |

(Continued)

OTHER PUBLICATIONS

U.S. Office Action dated Jul. 8, 2014 issued in U.S. Appl. No. 14/073,159.

(Continued)

*Primary Examiner* — Julio Maldonado
*Assistant Examiner* — Moin Rahman
(74) *Attorney, Agent, or Firm* — Scully, Scott, Murphy & Presser, P.C.; Joseph P. Abte, Esq.

(57) ABSTRACT

At least one layer including a scavenging material and a dielectric material is deposited over a gate stack, and is subsequently anisotropically etched to form a oxygen-scavenging-material-including gate spacer. The oxygen-scavenging-material-including gate spacer can be a scavenging-nanoparticle-including gate spacer or a scavenging-island-including gate spacer. The scavenging material is distributed within the oxygen-scavenging-material-including gate spacer in a manner that prevents an electrical short between a gate electrode and a semiconductor material underlying a gate dielectric. The scavenging material actively scavenges oxygen that diffuses toward the gate dielectric from above, or from the outside of, a dielectric gate spacer that can be formed around the oxygen-scavenging-material-including gate spacer.

18 Claims, 10 Drawing Sheets

(51) Int. Cl.
*H01L 29/78* (2006.01)
*H01L 21/8238* (2006.01)

(56) References Cited

U.S. PATENT DOCUMENTS

| | | | |
|---|---|---|---|
| 2007/0145498 A1 | 6/2007 | Metz et al. | |
| 2009/0079014 A1* | 3/2009 | Sandford et al. | 257/407 |
| 2009/0121258 A1* | 5/2009 | Kumar | 257/192 |
| 2009/0218632 A1* | 9/2009 | Cheng | 257/369 |
| 2010/0065924 A1 | 3/2010 | Lin et al. | |
| 2010/0289085 A1* | 11/2010 | Yuan et al. | 257/369 |
| 2010/0314697 A1* | 12/2010 | Adkisson et al. | 257/411 |
| 2010/0320547 A1* | 12/2010 | Ando et al. | 257/411 |
| 2011/0033996 A1* | 2/2011 | Deleonibus et al. | 438/287 |
| 2011/0298053 A1* | 12/2011 | Zhong et al. | 257/368 |

OTHER PUBLICATIONS

Office Action dated Jan. 3, 2014 received in a related U.S. Patent Application, namely U.S. Appl. No. 14/073,159.

* cited by examiner

OXYGEN SCAVENGING SPACER FOR A GATE ELECTRODE

BACKGROUND

The present disclosure generally relates to semiconductor devices, and particularly to complementary metal-oxide-semiconductor (CMOS) field effect transistors including an oxygen scavenging spacer, and methods of manufacturing the same.

Oxygen diffusion into a "high-k gate dielectric," i.e., a gate dielectric including a dielectric metal oxide having a dielectric constant grater than 8.0, and accompanying additional oxidation of the high-k gate dielectric cause a shift in the dielectric constant of the high-k gate dielectric. Such a shift in the dielectric constant of the high-k gate dielectric induces changes in the threshold voltage of a complementary metal oxide semiconductor (CMOS) transistor employing the high-k gate dielectric. Thus, it is necessary to prevent diffusion of oxygen into a high-k gate dielectric of the CMOS transistor in order to provide a stable threshold voltage that does not change with use of the CMOS transistor or in time.

BRIEF SUMMARY

At least one layer including a scavenging material and a dielectric material is deposited over a gate stack, and is subsequently anisotropically etched to form an oxygen-scavenging-material-including gate spacer. The oxygen-scavenging-material-including gate spacer can be a scavenging-nanoparticle-including gate spacer or a scavenging-island-including gate spacer. The scavenging material is distributed within the oxygen-scavenging-material-including gate spacer in a manner that prevents an electrical short between a gate electrode and a semiconductor material underlying a gate dielectric. The scavenging material can be a metal such as Al, La, or Ti, and actively scavenges oxygen that diffuses toward the gate dielectric from above, or from the outside of, a dielectric gate spacer that can be formed around the oxygen-scavenging-material-including gate spacer.

According to an aspect of the present disclosure, a semiconductor structure includes: a gate stack including a gate dielectric and a gate electrode and located on a semiconductor substrate; and an oxygen-scavenging-material-including gate spacer laterally surrounding the gate stack and contacting the semiconductor substrate.

According to another aspect of the present disclosure, a method of forming a semiconductor structure includes: forming a gate stack including a gate dielectric and a gate electrode on a semiconductor substrate; and forming an oxygen-scavenging-material-including gate spacer around the gate stack and directly on the semiconductor substrate.

DETAILED DESCRIPTION

Figure 1:
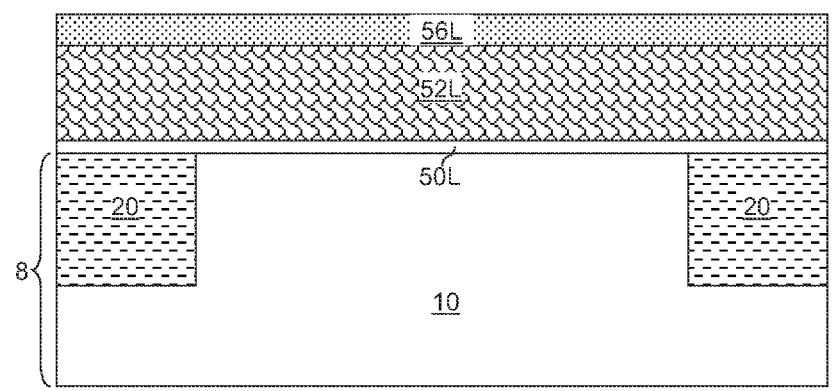
FIG. 1 is a vertical cross-sectional view of a first exemplary semiconductor structure after formation of gate stack layers according to a first embodiment of the present disclosure.

As stated above, the present disclosure relates to complementary metal-oxide-semiconductor (CMOS) field effect transistors including an oxygen scavenging spacer, and methods of manufacturing the same, which are now described in detail with accompanying figures. It is noted that like reference numerals refer to like elements across different embodiments. The drawings are not necessarily drawn to scale. The drawings are not necessarily drawn to scale.

Referring to FIG. 1, a first exemplary semiconductor structure according to a first embodiment of the present disclosure includes a semiconductor substrate 8 and gate stack layers formed thereupon. The semiconductor substrate 8 can be a semiconductor-on-insulator (SOI) semiconductor substrate or a bulk semiconductor substrate. The semiconductor substrate 8 includes a semiconductor region 10, which is a region of a single crystalline semiconductor material.

The semiconductor region 10 can be a top semiconductor layer of an SOI substrate or a bulk semiconductor substrate. The semiconductor region 10 has a p-type doping or n-type doping. The conductivity type of the doping of the semiconductor region 10 is herein referred to as a first conductivity type. Shallow trench isolation structures 20 including a dielectric material can be formed in the semiconductor substrate 8 to provide electrical isolation between neighboring semiconductor devices to be formed.

The gate stack layers can include a stack, from bottom to top, of a gate dielectric layer 50L, a gate conductor layer 52L, and optionally, a gate cap dielectric layer 56L. The gate stack layers (50L, 52L, 56L) can be "blanket" layers, i.e., unpatterned planar layers, each having a uniform thickness throughout.

The gate dielectric layer 50L includes a dielectric material, which can be silicon oxide, silicon nitride, silicon oxynitride, or a stack thereof. Alternately, the gate dielectric layer 50L can be a high dielectric constant (high-k) material layer having a dielectric constant greater than 8.0. In one embodiment, the gate dielectric layer 50L can include a dielectric metal oxide, which is a high-k material containing a metal and oxygen, and is known in the art as a high-k gate dielectric material. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y2O_xN_y$, a silicate thereof, and an alloy thereof. Each value of x is independently from 0.5 to 3 and each value of y is independently from 0 to 2. The thickness of the gate dielectric layer 50L can be from 0.9 nm to 6 nm, although lesser and greater thicknesses can also be employed.

The gate conductor layer 52L includes a conductive material, which can be a doped semiconductor material, a metallic material, or a combination thereof. The doped semiconductor material, if present, can be doped polysilicon, doped polycrystalline germanium, a doped silicon-germanium alloy, any other doped elemental or compound semiconductor material, or a combination thereof. The metallic material, if present, can be any metallic material that can be deposited by chemical vapor deposition (CVD), physical vapor deposition (PVD), or a combination thereof. For example, the metallic material can include aluminum and/or tungsten. The thickness of the gate conductor layer 52L can be from 100 nm to 500 nm, although lesser and greater thicknesses can also be employed.

The gate cap dielectric layer 56L includes a dielectric material such as silicon nitride, silicon oxide, organosilicate glass (OSG), a high dielectric constant (high-k) material layer that can be employed for the gate dielectric layer 50L, or a combination thereof. The gate cap dielectric layer 56L can be deposited, for example, by chemical vapor deposition or by any other deposition method known in the art. The thickness of the gate cap dielectric layer 56L can be from 10 nm to 200 nm, and typically from 20 nm to 100 nm, although lesser and greater thicknesses can also be employed.

Figure 2:
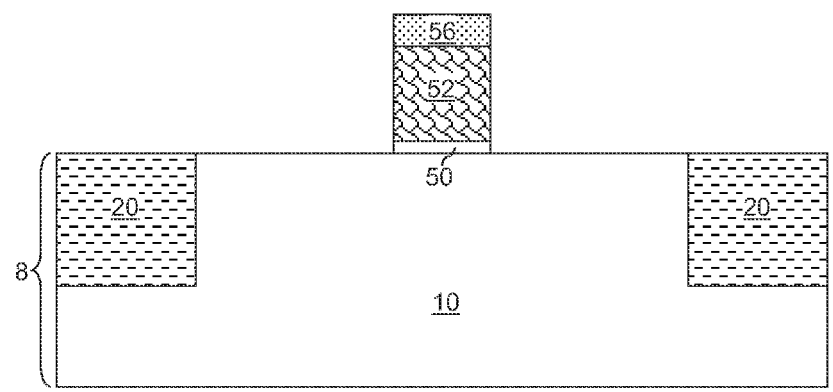
FIG. 2 is a vertical cross-sectional view of the first exemplary semiconductor structure after formation of a gate stack according to the first embodiment of the present disclosure.

Referring to FIG. 2, a gate stack is formed by patterning the gate stack layers (50L, 52L, 56L). Specifically, the gate stack layers (50L, 52L, 56L) can be patterned by an anisotropic etch process employing a patterned photoresist (not shown) as a masking layer.

The remaining portion of the gate cap dielectric layer 56L is a gate cap dielectric 56. Because the gate cap dielectric layer 56L is optional, the gate cap dielectric 56 is also optional, i.e., may, or may not, be present. The remaining portion of the gate conductor layer 52L is a gate conductor 52. The remaining portion of the gate dielectric layer 50L is a gate dielectric 50. The gate stack includes the gate cap dielectric 56, the gate conductor 52, and the gate dielectric 50. The sidewalls of the gate conductor 52 are vertically coincident, i.e., coincide in a top down view along a direction perpendicular to the top surface of the semiconductor substrate 8, with the sidewalls of the gate cap dielectric 56 and with the sidewalls of the gate dielectric 50. The stack of the gate dielectric 50, the gate conductor 52, and the optional gate cap dielectric 56 is herein referred to as a gate stack (50, 52, 56).

Figure 3:
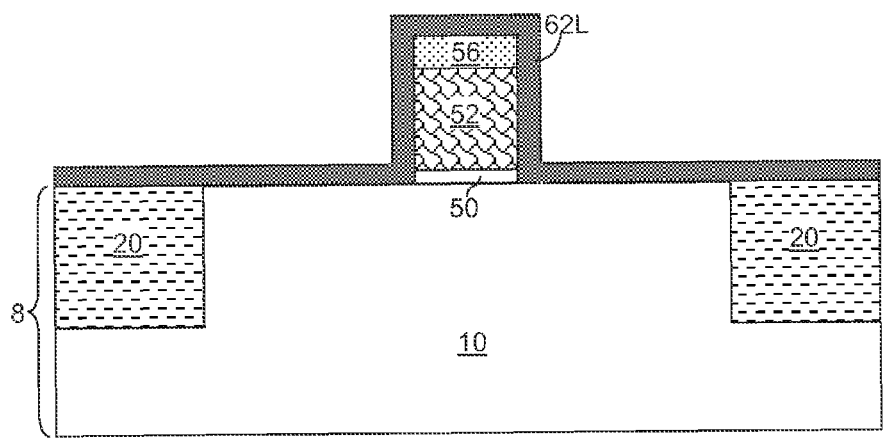
FIG. 3 is a vertical cross-sectional view of the first exemplary semiconductor structure after formation of a scavenging-nanoparticle-including gate spacer layer according to the first embodiment of the present disclosure.

Referring to FIG. 3, a scavenging-nanoparticle-including dielectric material layer 62L is deposited on the exposed surfaces of the semiconductor substrate 8 and the gate stack (50, 52, 56). In one embodiment, the scavenging-nanoparticle-including dielectric material layer 62L includes an oxygen-impermeable dielectric material, i.e., a dielectric material through which oxygen does not diffuse. For example, the scavenging-nanoparticle-including dielectric material layer 62L can include silicon nitride.

As used herein, a scavenging material is a metal having a negative free energy of formation for a metal oxide. Thus, a scavenging material combines with any available atomic oxygen or oxygen molecules to be become oxidized. Any elemental metal capable of forming a metal oxide can be a scavenging material. In one embodiment, the scavenging material is selected from a group of elemental metals that are easily oxidized. For example, the scavenging material can be selected form Group IA elements, Group IIA elements, Group IIIA elements, Group IIIB elements, Group IVB elements, Lanthanides, and Actinides.

In one embodiment, the scavenging material includes, but is not limited to, Al, Be, Mg, Ca, Sr, Ba, Sc, Y, La, Ti, Zr, Hf, Dy, Lu, Er, Pr, and Ce. In one embodiment, the scavenging material can consist of at least one alkaline earth metal. In another embodiment, the scavenging material can consist of at least one transition metal. In yet another embodiment, the scavenging material can consist of a mixture of at least one alkaline earth metal and at least one transition metal.

In one embodiment, the scavenging material can be selected from a highly oxidizable element such as aluminum, lanthanum, or titanium, or a combination thereof.

As used herein, a nanoparticle is a particle having a maximum dimension less than 10 nanometers.

As used herein, a scavenging nanoparticle is a nanoparticle including a scavenging material.

As used herein, a scavenging-nanoparticle-including element is an element that includes at least one scavenging nanoparticle.

Within the scavenging-nanoparticle-including dielectric material layer 62L, scavenging nanoparticles are embedded at sizes and at a density that does not render the scavenging-nanoparticle-including dielectric material layer 62L electrically conductive.

In one embodiment, the scavenging-nanoparticle-including dielectric material layer 62L can be formed, for example, by alternation of a series of chemical vapor deposition (CVD) or atomic layer deposition (ALD) processes and a series of physical vapor deposition (PVD) processes. Each of the CVD or ALD processes deposits a layer of a dielectric material, which can be a layer of silicon nitride, having a thickness from 0.5 nm to 5 nm. Each of the PVD processes deposits nanoparticles of a scavenging material, i.e., scavenging nanoparticles. The scavenging nanoparticles deposited in each PVD process do not form a continuous layer, but are deposited as discrete particles such that most of the scavenging nanoparticles do not contact any other scavenging particle.

The PVD process can be a non-directional PVD process in which the sputtered scavenging nanoparticles from a sputtering target are not collimated in order to provide deposition of the scavenging nanoparticles on vertical surfaces such as the sidewalls of the gate stack (50, 52, 56).

In another embodiment, the scavenging-nanoparticle-including dielectric material layer 62L can be formed, for example, by alternation of a series of chemical vapor deposition (CVD) or first atomic layer deposition (ALD) processes and a series of second atomic layer deposition (PVD) processes. Each of the CVD or first ALD processes deposits a layer of a dielectric material, which can be a layer of silicon nitride, having a thickness from 0.5 nm to 5 nm. Each of the second ALD processes deposits scavenging nanoparticles. The scavenging nanoparticles deposited in each second ALD process do not form a continuous layer, but are deposited as discrete particles such that most of the scavenging nanoparticles do not contact any other scavenging particle.

In still another embodiment, the scavenging-nanoparticle-including dielectric material layer 62L can be formed, for example, by alternation of a series of first chemical vapor deposition (CVD) or atomic layer deposition (ALD) processes and a series of second chemical vapor deposition (CVD) processes. Each of the first CVD or ALD processes deposits a layer of a dielectric material, which can be a layer of silicon nitride, having a thickness from 0.5 nm to 5 nm. Each of the second CVD processes deposits scavenging nanoparticles. The scavenging nanoparticles deposited in each second CVD process do not form a continuous layer, but are deposited as discrete particles such that most of the scavenging nanoparticles do not contact any other scavenging particle.

In one embodiment, the areal coverage of the scavenging nanoparticles in each PVD process or second ALD process or second CVD process can be less than 10% of the area of an underlying layer of the dielectric material, which is a portion of the scavenging-nanoparticle-including dielectric material layer 62L.

The number of PVD processes within the series of PVD processes, the number of the second ALD processes within the series of second ALD processes, or the number of the second CVD processes within the series of second CVD processes, can be from 1 to 100, although a greater number of repetitions for the PVD processes can also be employed.

The scavenging-nanoparticle-including dielectric material layer 62L may, or may not, be conformal. The thickness of the scavenging-nanoparticle-including dielectric material layer 62L, as measured at the sidewalls of the gate stack (50, 52, 56), can be from 3 nm to 100 nm, although lesser and greater thicknesses can also be employed.

A contiguous stack of dielectric material layers deposited by the series of chemical vapor deposition (CVD) or first atomic layer deposition (ALD) processes form an insulating matrix of the scavenging-nanoparticle-including dielectric material layer 62L such that the insulating matrix embeds the scavenging nanoparticles. Each dielectric material layer in the contiguous stack functions as a diffusion barrier layer for oxygen and for the scavenging nanoparticles.

Figure 4:
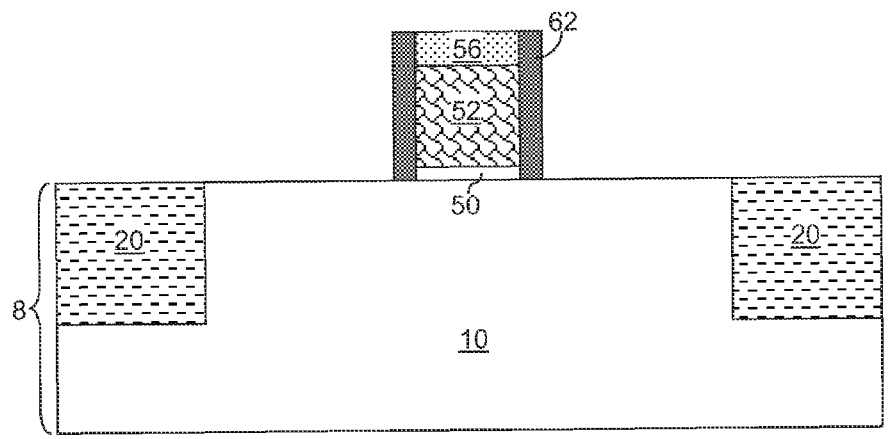
FIG. 4 is a vertical cross-sectional view of the first exemplary semiconductor structure after formation of a scavenging-nanoparticle-including gate spacer according to the first embodiment of the present disclosure.

Referring to FIG. 4, an anisotropic etch is performed to removes horizontal portions of the scavenging-nanoparticle-including dielectric material layer 62L. The anisotropic etch can be, for example, a reactive ion etch. Remaining vertical portions of the scavenging-nanoparticle-including dielectric material layer 62L constitute a scavenging-nanoparticle-including gate spacer 62. The thickness of the a scavenging-nanoparticle-including gate spacer 62, as measured at the base of the sidewalls of the gate stack (50, 52, 56), can be from 3 nm to 100 nm, although lesser and greater thicknesses can also be employed.

The scavenging-nanoparticle-including gate spacer 62 is an oxygen-scavenging-material-including gate spacer. As used herein, an "oxygen-scavenging-material-including" element is an element that includes at least one material that scavenges oxygen. The scavenging-nanoparticle-including gate spacer 62 laterally surrounds the gate stack (50, 52, 56) and contacts the semiconductor substrate 8. Nanoparticles including a scavenging metal are embedded in a dielectric material within the scavenging-nanoparticle-including gate spacer 62.

The gate electrode 52 is not electrically shorted to the semiconductor region 10, which is a semiconductor material located in the semiconductor substrate 8 and contacting the gate dielectric 50. The oxygen-scavenging material in the scavenging-nanoparticle-including gate spacer 62 can be any of the oxygen-scavenging-material described above. In one embodiment, the scavenging-nanoparticle-including gate spacer 62 includes an oxygen-scavenging material selected from an elemental metal or an alloy of at least two elemental metals. In one embodiment, the scavenging-nanoparticle-including gate spacer 62 includes elemental aluminum, elemental lanthanum, elemental titanium, or an alloy of at least two of elemental aluminum, elemental lanthanum, and elemental titanium.

In one embodiment, the oxygen-scavenging-material within the scavenging-nanoparticle-including gate spacer 62 does not contact a semiconductor material in the semiconductor substrate 8. This configuration can be provided by depositing a dielectric material layer that covers the entire exposed surface of the semiconductor substrate 8 before forming scavenging nanoparticles.

Figure 5:
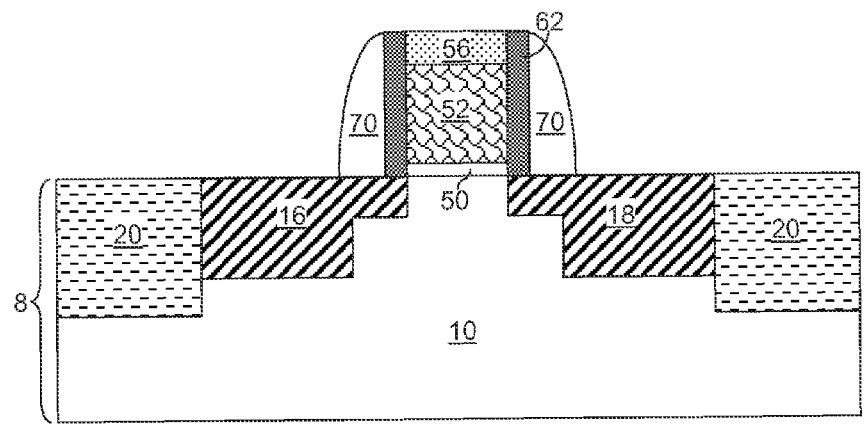
FIG. 5 is a vertical cross-sectional view of the first exemplary semiconductor structure after formation of a dielectric gate spacer and source and drain regions according to the first embodiment of the present disclosure.

Referring to FIG. 5, a source region 16 and a drain region 18 are formed, for example, by ion implantation of electrical dopants or by substitution of portions of the semiconductor region 10 with a doped semiconductor material employing methods known in the art. A dielectric gate spacer 70 can be formed around the scavenging-nanoparticle-including gate spacer 62, for example, by deposition of a dielectric material layer including an oxygen-impermeable material such as silicon nitride and a subsequent anisotropic etch.

Figure 6:
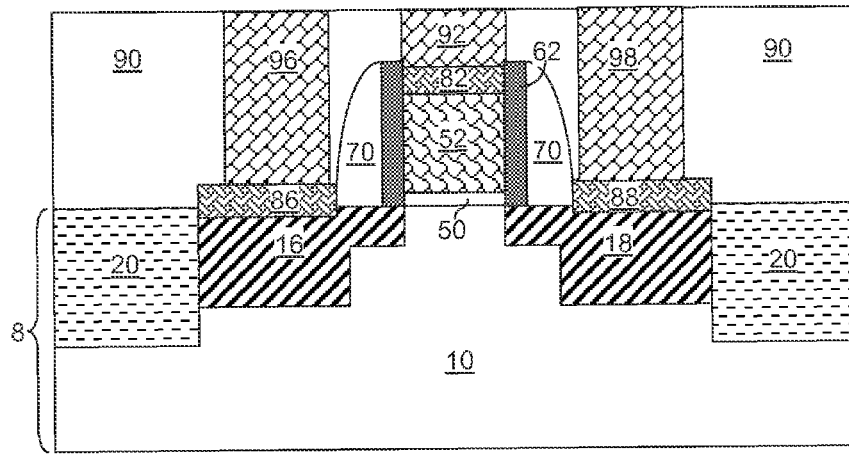
FIG. 6 is a vertical cross-sectional view of the first exemplary semiconductor structure after formation of a contact-level dielectric layer, metal-semiconductor alloy portions, and contact via structures according to the first embodiment of the present disclosure.

Referring to FIG. 6, a contact-level dielectric layer 90 is formed over the gate stack (50, 52, 56) and the semiconductor substrate 8. The contact-level dielectric layer 90 can include any material that can be employed as a dielectric material in metal interconnect structures. For example, the contact-level dielectric layer 90 can include doped or undoped silicate glass, silicon nitride, organosilicate glass, or a combination thereof.

Various metal-semiconductor alloy portions and contact via structures can be formed. The various metal-semiconductor alloy portions can include, for example, a source-side metal semiconductor alloy portion 86, a drain-side metal semiconductor alloy portion 88, and a gate-side metal semiconductor alloy portion 82. The various metal-semiconductor alloy portions can include a metal silicide if the source region 16 and the drain region 18 include silicon. The contact via structures can include, for example, a source-side contact via structure 96, a drain-side contact via structure 98, and a gate-side contact via structure 92.

Figure 7:
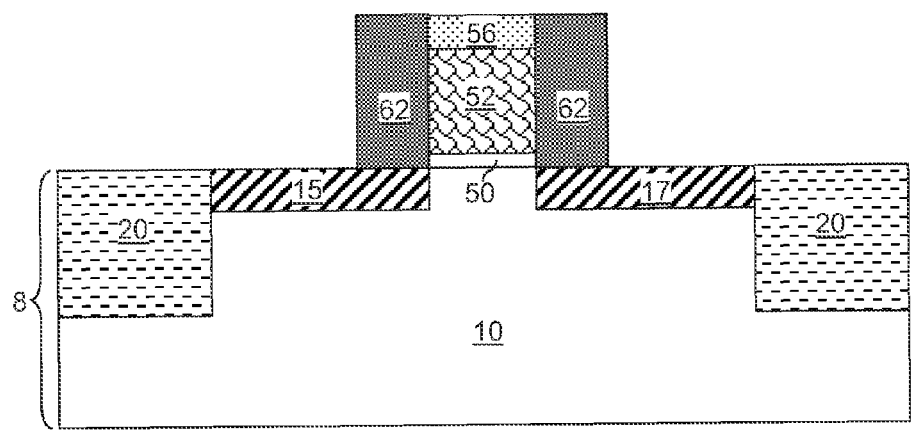
FIG. 7 is a vertical cross-sectional view of a second exemplary semiconductor structure after formation of a source extension region, a drain extension region, and a scavenging-nanoparticle-including gate spacer according to a second embodiment of the present disclosure.

Referring to FIG. 7, a second exemplary semiconductor structure according to a second embodiment of the present disclosure is derived from the first exemplary semiconductor structure of FIG. 2 by forming a source extension region 15 and a drain extension region 17, and then forming a scavenging-nanoparticle-including gate spacer 62.

Specifically, the source extension region 15 and the drain extension region 17 can be simultaneously formed by implanting electrical dopants into portions of the semiconductor region 10 that are not covered by the gate stack (50, 52, 56).

A scavenging-nanoparticle-including dielectric material layer is deposited and anisotropically etched employing the same processing steps as the processing steps of FIGS. 3 and 4 in the first embodiment. A scavenging-nanoparticle-including gate spacer 62 is formed. The scavenging-nanoparticle-including gate spacer 62 contacts and overlies the source extension region 15 and the drain extension region.

The thickness of the scavenging-nanoparticle-including dielectric material layer as deposited, and the width of the scavenging-nanoparticle-including gate spacer 62, as measured at the sidewalls of the gate stack (50, 52, 56), is selected to equal the lateral offset between an end portion of the source extension region 15 proximal to the gate stack (50, 52, 56) and an end portion of a deep source region (to be subsequently formed) proximal to the gate stack (50, 52, 56). The width of the scavenging-nanoparticle-including gate spacer 62 can be from 5 nm to 150 nm, although lesser and greater widths can also be employed.

Figure 8:
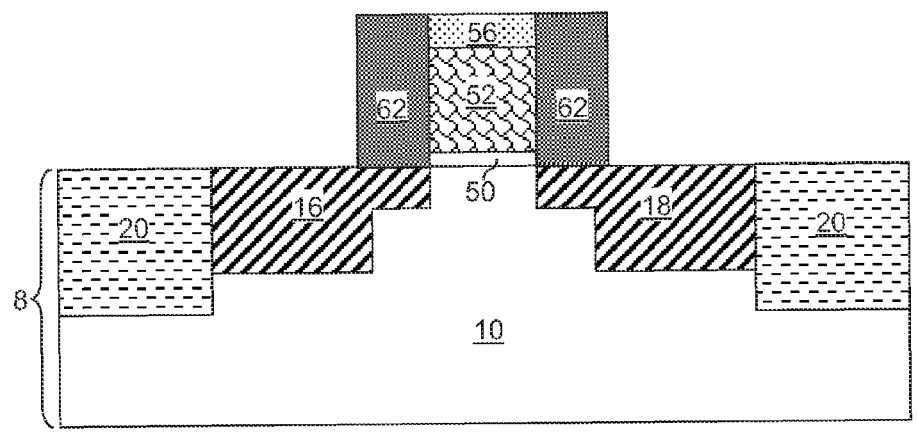
FIG. 8 is a vertical cross-sectional view of the second exemplary semiconductor structure after formation of a deep source region and a deep drain region, which merge with the source extension region and the drain extension region to form a source region and a drain region, respectively, according to the second embodiment of the present disclosure.

Referring to FIG. 8, a deep source region and a deep drain region are formed by implanting additional dopants into portions of the semiconductor region 10 that are not covered by the combination of the gate stack (50, 52, 56) and the scavenging-nanoparticle-including gate spacer 62. The source extension region 15 and the deep source region are merged to form a source region 16, and the drain extension region 17 and the deep drain region are merged to form a drain region 18.

Figure 9:
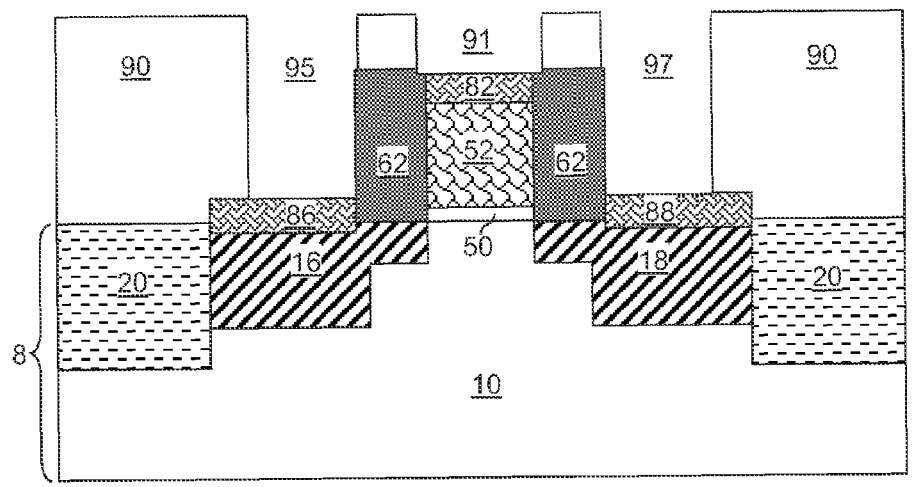
FIG. 9 is a vertical cross-sectional view of the second exemplary semiconductor structure after formation of various metal semiconductor alloy portions, a contact-level dielectric layer, and various contact via holes according to the second embodiment of the present disclosure.

Referring to FIG. 9, various metal-semiconductor alloy portions can be formed. The various metal-semiconductor alloy portions can include, for example, a source-side metal semiconductor alloy portion 86, a drain-side metal semiconductor alloy portion 88, and a gate-side metal semiconductor alloy portion 82. The various metal-semiconductor alloy portions can include a metal silicide if the source region 16 and the drain region 18 include silicon.

A contact-level dielectric layer 90 is formed over the gate stack (50, 52, 56) and the semiconductor substrate 8. The contact-level dielectric layer 90 can include any material that can be employed as a dielectric material in metal interconnect structures. For example, the contact-level dielectric layer 90 can include doped or undoped silicate glass, silicon nitride, organosilicate glass, or a combination thereof.

Various contact via holes are formed by etching portions of the contact-level dielectric layer 90. The various contact via holes can be formed in self-alignment with the scavenging-nanoparticle-including gate spacer 62 by employing an etch chemistry that etches the material of the contact-level dielectric layer 90, while not etching the material of the scavenging-nanoparticle-including gate spacer 62. In this case, the various contact via holes can include a source-side contact via hole 95, a drain-side contact via hole 96, and a gate-side contact via hole 91.

Figure 10:
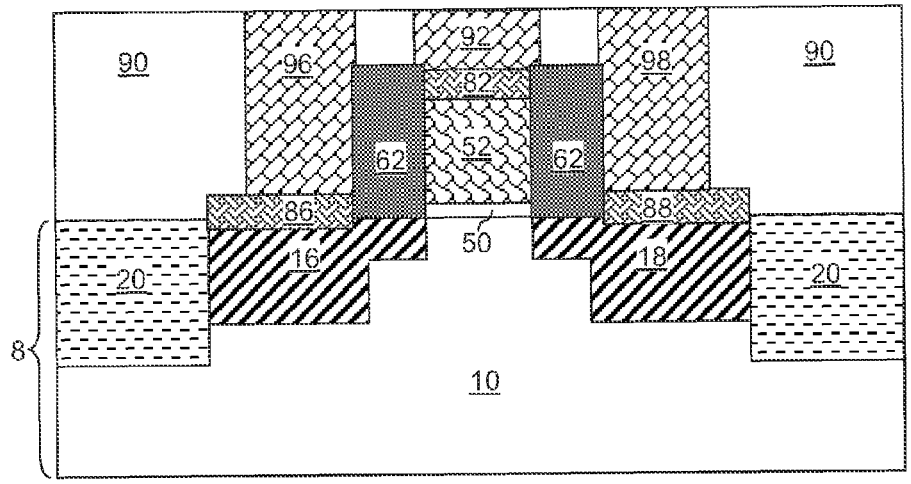
FIG. 10 is a vertical cross-sectional view of the second exemplary semiconductor structure after formation of various contact via structures according to the second embodiment of the present disclosure.

Referring to FIG. 10, various contact via structures are formed, for example, by depositing a conductive material into the various contact via holes (91, 95, 97) and removing excess conductive material from above the top surface of the contact-level dielectric layer 90. The various contact via structures can include, for example, a source-side contact via structure 96, a drain-side contact via structure 98, and a gate-side contact via structure 92. The source-side contact via structure 96 can be in contact with a top surface of the source-side metal semiconductor alloy portion 86 and an outer sidewall of the scavenging-nanoparticle-including gate spacer 62. The drain-side contact via structure 98 can be in contact with a top surface of the drain-side metal semiconductor alloy portion 88 and another outer sidewall of the scavenging-nanoparticle-including gate spacer 62. The gate-side contact via structure 92 can be in contact with a top surface of the gate-side metal semiconductor alloy portion 82 and a top surface and/or inner sidewalls of the scavenging-nanoparticle-including gate spacer 62.

Figure 11:
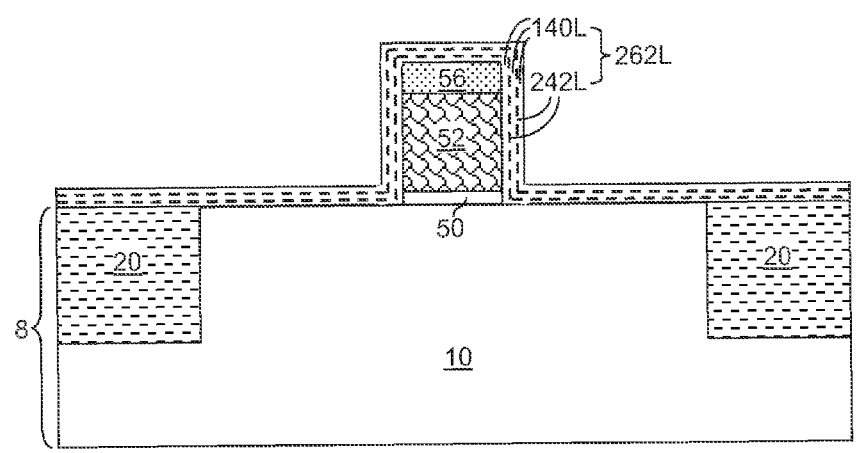
FIG. 11 is a vertical cross-sectional view of a third exemplary semiconductor structure after formation of a layer stack including at least one scavenging material island layer according to a third embodiment of the present disclosure.

Referring to FIG. 11, a third exemplary semiconductor structure according to a third embodiment of the present disclosure can be derived from the first exemplary semiconductor structure of FIG. 2 by forming a layer stack 262L including at least one scavenging material island layer 242L and at least one contiguous dielectric material layer 140L.

The layer stack 262L can be formed by modifying the methods for the layer stack 162 of the second embodiment. Specifically, each of the at least one scavenging material island layer 242 can be formed by shortening the deposition time for at least one contiguous scavenging material layer 142L. Less than one monolayer of scavenging nanoparticles is deposited. The scavenging nanoparticles are deposited at a sufficient density and at a temperature to allow sufficient surface diffusion of the scavenging nanoparticles. The scavenging nanoparticles diffusing on the surface of an underlying continuous dielectric material layer 140 coalesce to form scavenging material islands having a lateral dimension from 5 nm to 50 nm. The amount of the scavenging material within each scavenging material island layer 242L can be equivalent, in mass, to 0.2~0.8 monolayer of the scavenging material. The areal coverage of the scavenging material islands in each scavenging material island layer 242L can be from 20% to 80% of the area of an underlying contiguous dielectric material layer 140L.

Each of the at least one contiguous dielectric material layer 140L can be deposited employing the same method as in the second embodiment.

Each scavenging material island layer 242L can be deposited by a physical vapor deposition (PVD) process, an atomic layer deposition (ALD) process, or a second chemical vapor deposition (CVD) process. Each scavenging material island layer 242L is deposited as a set of disjoined islands of a scavenging material. A subsequently deposited contiguous dielectric material layer 140L contacts portions of an immediately preceding contiguous dielectric material layer 140.

The number of the at least one contiguous dielectric material layer 140L can be from 1 to 100, although a greater number can also be employed. The number of the at least one scavenging material island layer 242L can be from 1 to 100, although a greater number can also be employed.

Each of the at least one contiguous dielectric material layer 140L and the at least one contiguous scavenging material layer 142L may, or may not, be conformal. The thickness of the layer stack 262L, as measured at the sidewalls of the gate stack (50, 52, 56), can be from 3 nm to 100 nm, although lesser and greater thicknesses can also be employed.

Figure 12:
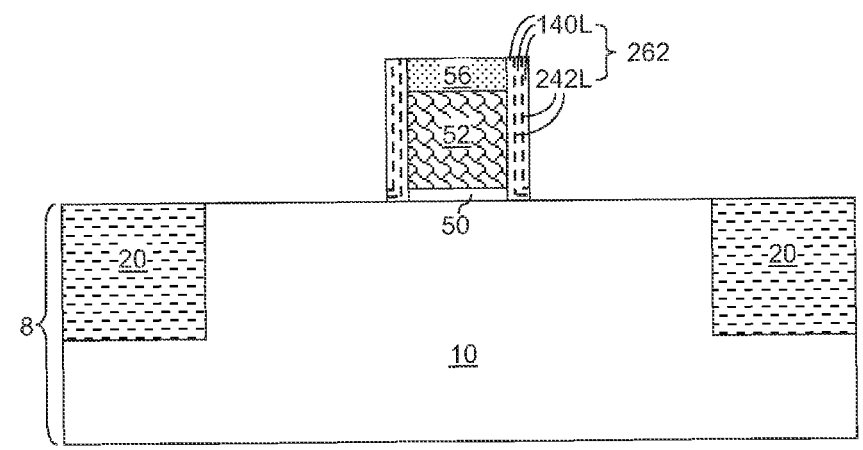
FIG. 12 is a vertical cross-sectional view of the third exemplary semiconductor structure after formation of a scavenging-island-including gate spacer according to the third embodiment of the present disclosure.

Referring to FIG. 12, an anisotropic etch is performed to removes horizontal portions of the layer stack 262L. The anisotropic etch can be, for example, a reactive ion etch. Remaining vertical portions of the layer stack 262L constitute a scavenging-island-including gate spacer 262. Multiple scavenging islands that do not contact one another can be embedded in at least two contiguous dielectric material layers 140L. The thickness of the scavenging-island-including gate spacer 262, as measured at the base of the sidewalls of the gate stack (50, 52, 56), can be from 3 nm to 100 nm, although lesser and greater thicknesses can also be employed.

The scavenging-island-including gate spacer 262 is an oxygen-scavenging-material-including gate spacer. The scavenging-island-including gate spacer 262 laterally surrounds the gate stack (50, 52, 56) and contacts the semiconductor substrate 8.

The gate electrode 52 is not electrically shorted to the semiconductor region 10, which is a semiconductor material located in the semiconductor substrate 8 and contacting the gate dielectric 50. The oxygen-scavenging material in the scavenging-island-including gate spacer 262 can be any of the oxygen-scavenging-material described above. In one embodiment, the scavenging-island-including gate spacer 262 includes an oxygen-scavenging material selected from an elemental metal or an alloy of at least two elemental metals. In one embodiment, the scavenging-island-including gate spacer 262 includes elemental aluminum, elemental lanthanum, elemental titanium, or an alloy of at least two of elemental aluminum, elemental lanthanum, and elemental titanium.

In one embodiment, the oxygen-scavenging-material within the scavenging-island-including gate spacer 262 does not contact a semiconductor material in the semiconductor substrate 8. This configuration can be provided by depositing the first layer among the at least one contiguous dielectric material layers 140L before depositing the first layer among the at least one scavenging material island layer 242L.

Figure 13:
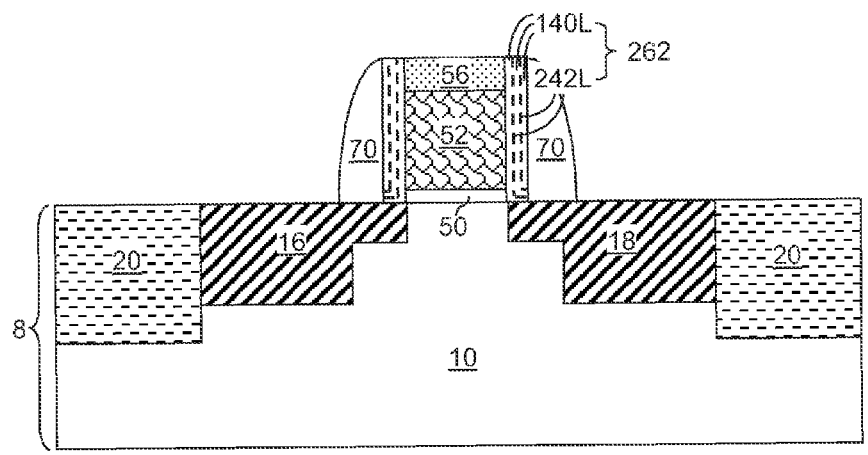
FIG. 13 is a vertical cross-sectional view of the third exemplary semiconductor structure after formation of a dielectric gate spacer and source and drain regions according to the third embodiment of the present disclosure.
Figure 14:
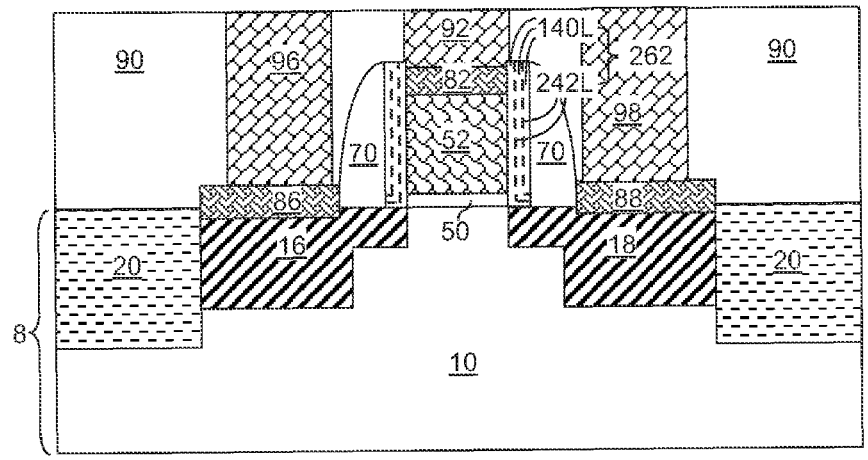
FIG. 14 is a vertical cross-sectional view of the third exemplary semiconductor structure after formation of a contact-level dielectric layer, metal-semiconductor alloy portions, and contact via structures according to the third embodiment of the present disclosure.

Referring to FIGS. 13 and 14, a source region 16, a drain region 18, a dielectric gate spacer 70, a contact-level dielectric layer 90, various metal-semiconductor alloy portions (82, 86, 88), and contact via structures (92, 96, 98) can be formed in the same manner as in the first embodiment.

Each of the first exemplary structure illustrated in FIG. 4, the second exemplary structure illustrated in FIG. 8, and the third exemplary structure illustrated in FIG. 12 can be subjected to an oxidizing ambient during subsequent processing steps such as the processing steps of FIGS. 5, 6, 9, 10, 13, and/or 14. In some embodiments, oxygen may diffuse into an upper portion of the scavenging-nanoparticle-including gate spacer 62, an upper portion of the scavenging-material-layer-including gate spacer 162, or an upper portion of the scavenging-island-including gate spacer 262 during such an oxidizing ambient, which can be, for example, an elevated temperature anneal for electrically activating dopants in the source region 16 and the drain region 18.

Figure 15:
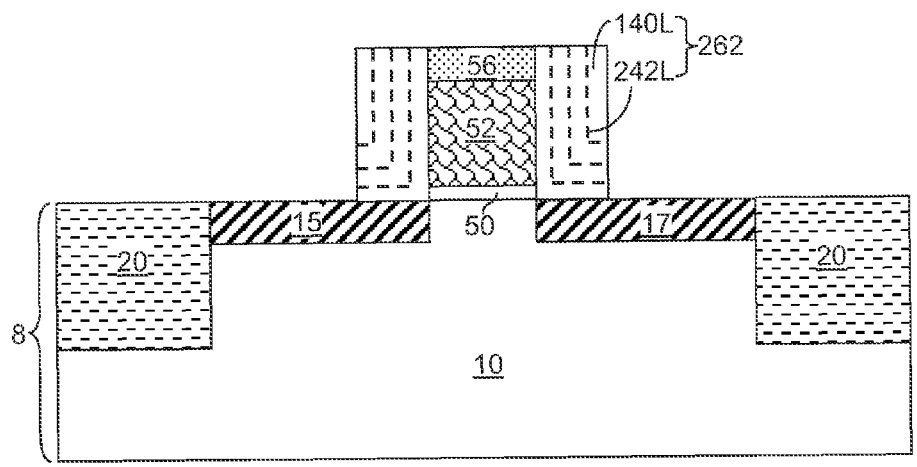
FIG. 15 is a vertical cross-sectional view of a fourth exemplary semiconductor structure after formation of a source extension region, a drain extension region, and a scavenging-island-including gate spacer according to a fourth embodiment of the present disclosure.

Referring to FIG. 15, a fourth exemplary semiconductor structure according to a fourth embodiment of the present disclosure is derived from the first exemplary semiconductor structure of FIG. 2 by forming a source extension region 15 and a drain extension region 17, and then forming a scavenging-island-including gate spacer 262.

Specifically, the source extension region 15 and the drain extension region 17 can be simultaneously formed by implanting electrical dopants into portions of the semiconductor region 10 that are not covered by the gate stack (50, 52, 56).

A layer stack including at least one scavenging material island layer 242L and at least one contiguous dielectric material layer 140L is deposited and anisotropically etched employing the same processing steps as the processing steps of FIGS. 11 and 12 in the third embodiment. A scavenging-island-including gate spacer 262 is formed. The scavenging-island-including gate spacer 262 contacts and overlies the source extension region 15 and the drain extension region.

The thickness of the deposited layer stack including at least one scavenging material island layer 242L and at least one contiguous dielectric material layer 140L, and the width of the scavenging-island-including gate spacer 262, as measured at the sidewalls of the gate stack (50, 52, 56), is selected to equal the lateral offset between an end portion of the source extension region 15 proximal to the gate stack (50, 52, 56) and an end portion of a deep source region (to be subsequently formed) proximal to the gate stack (50, 52, 56). The width of the scavenging-island-including gate spacer 262 can be from 5 nm to 150 nm, although lesser and greater widths can also be employed.

Figure 16:
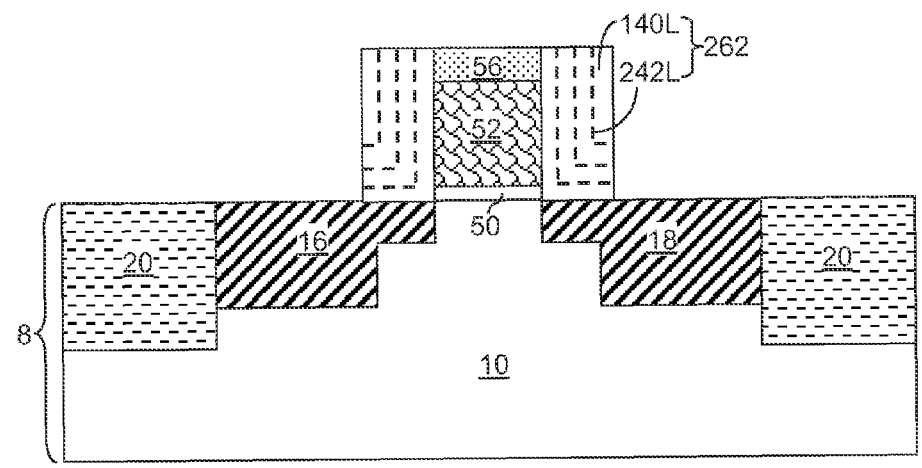
FIG. 16 is a vertical cross-sectional view of the fourth exemplary semiconductor structure after formation of a deep source region and a deep drain region, which merge with the source extension region and the drain extension region to form a source region and a drain region, respectively, according to the fourth embodiment of the present disclosure.

Referring to FIG. 16, a deep source region and a deep drain region are formed by implanting additional dopants into portions of the semiconductor region 10 that are not covered by the combination of the gate stack (50, 52, 56) and the scavenging-island-including gate spacer 262. The source extension region 15 and the deep source region are merged to form a source region 16, and the drain extension region 17 and the deep drain region are merged to form a drain region 18.

Figure 17:
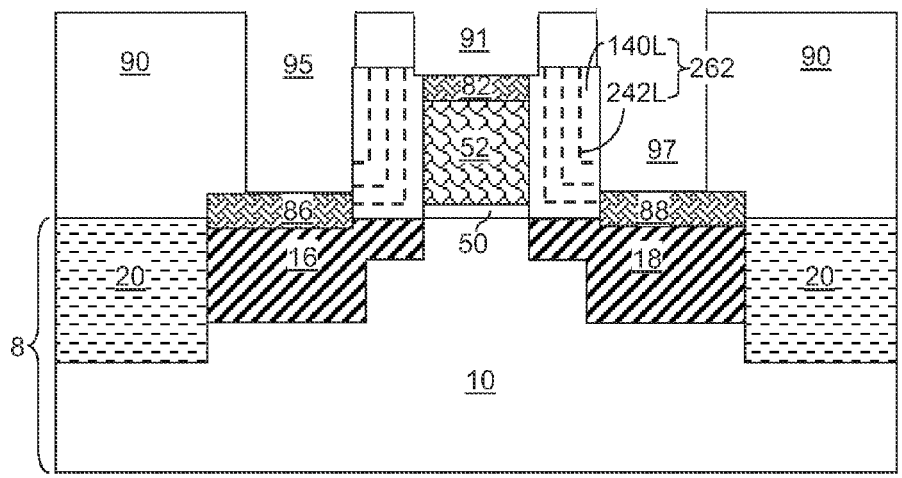
FIG. 17 is a vertical cross-sectional view of the fourth exemplary semiconductor structure after formation of various metal semiconductor alloy portions, a contact-level dielectric layer, and various contact via holes according to the fourth embodiment of the present disclosure.

Referring to FIG. 17, various metal-semiconductor alloy portions can be formed. The various metal-semiconductor alloy portions can include, for example, a source-side metal semiconductor alloy portion 86, a drain-side metal semiconductor alloy portion 88, and a gate-side metal semiconductor alloy portion 82. The various metal-semiconductor alloy portions can include a metal silicide if the source region 16 and the drain region 18 include silicon.

A contact-level dielectric layer 90 is formed over the gate stack (50, 52, 56) and the semiconductor substrate 8. The contact-level dielectric layer 90 can include any material that can be employed as a dielectric material in metal interconnect structures. For example, the contact-level dielectric layer 90 can include doped or undoped silicate glass, silicon nitride, organosilicate glass, or a combination thereof.

Various contact via holes are formed by etching portions of the contact-level dielectric layer 90. The various contact via holes can be formed in self-alignment with the scavenging-island-including gate spacer 262 by employing an etch chemistry that etches the material of the contact-level dielectric layer 90, while not etching the material of the scavenging-island-including gate spacer 262. In this case, the various contact via holes can include a source-side contact via hole 95, a drain-side contact via hole 96, and a gate-side contact via hole 91.

Figure 18:
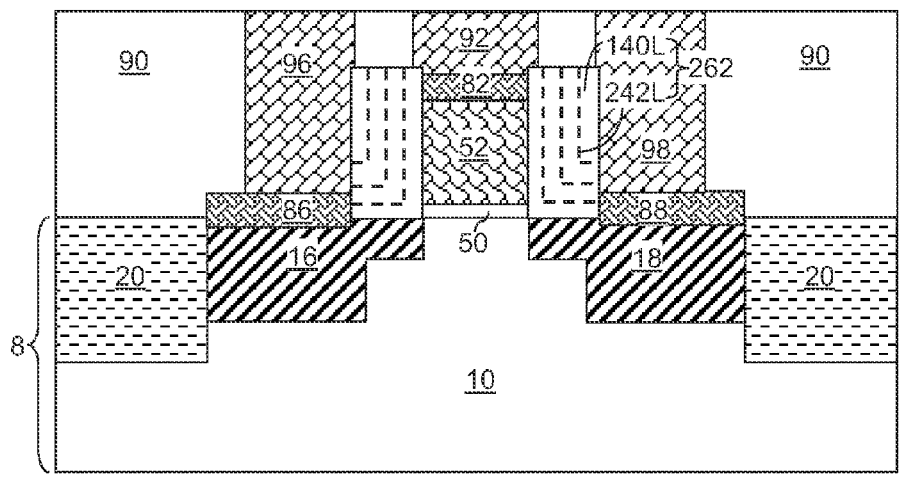
FIG. 18 is a vertical cross-sectional view of the fourth exemplary semiconductor structure after formation of various contact via structures according to the fourth embodiment of the present disclosure.

Referring to FIG. 18, various contact via structures are formed, for example, by depositing a conductive material into the various contact via holes (91, 95, 97) and removing excess conductive material from above the top surface of the contact-level dielectric layer 90. The various contact via structures can include, for example, a source-side contact via structure 96, a drain-side contact via structure 98, and a gate-side contact via structure 92. The source-side contact via structure 96 can be in contact with a top surface of the source-side metal semiconductor alloy portion 86 and an outer sidewall of the scavenging-island-including gate spacer 262. The drain-side contact via structure 98 can be in contact with a top surface of the drain-side metal semiconductor alloy portion 88 and another outer sidewall of the scavenging-island-including gate spacer 262. The gate-side contact via structure 92 can be in contact with a top surface of the gate-side metal semiconductor alloy portion 82 and a top surface and/or inner sidewalls of the scavenging-island-including gate spacer 262.

Figure 19:
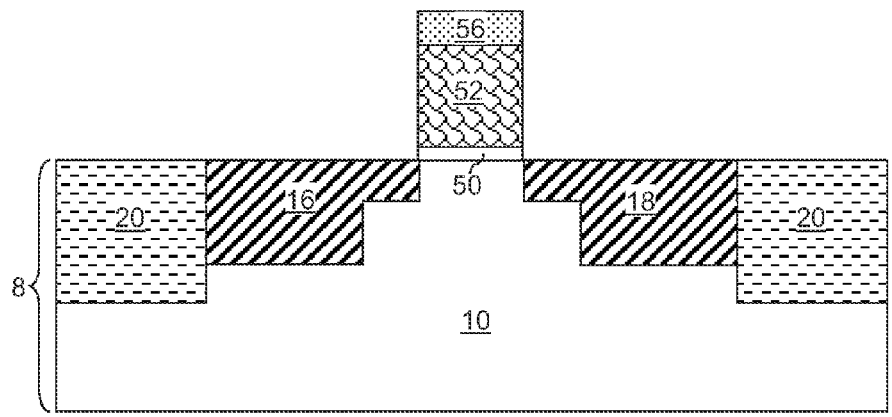
FIG. 19 is a vertical cross-sectional view of a fifth exemplary semiconductor structure after removal of a scavenging-nanoparticle-including gate spacer, a scavenging-material-layer-including gate spacer, a scavenging-island-including gate spacer, a scavenging-island-including gate spacer, or a partially oxidized scavenging-material-layer-including gate spacer, according to a fifth embodiment of the present disclosure.

Referring to FIG. 19, a fifth exemplary semiconductor structure according to a fifth embodiment of the present disclosure can be derived from the first exemplary semiconductor structure of FIG. 5, a variant of the first exemplary semiconductor structure of FIG. 5 in which a dielectric gate spacer 70 is not present, the second exemplary semiconductor structure of FIG. 9, a variant of the second exemplary semiconductor structure of FIG. 9 in which a dielectric gate spacer 70 is not present, the third exemplary semiconductor structure of FIG. 13, a variant of the third exemplary semiconductor structure of FIG. 13 in which a dielectric gate spacer 70 is not present, the fourth exemplary semiconductor structure of FIG. 15, or a variant of the fourth exemplary semiconductor structure of FIG. 15 in which a dielectric gate spacer 70 is not present, by removing the scavenging-nanoparticle-including gate spacer 62, the lower portion of the scavenging-material-layer-including gate spacer 162, or the lower portion of the scavenging-island-including gate spacer 262.

In one embodiment, the removal of the scavenging-nanoparticle-including gate spacer 62, the lower portion of the scavenging-material-layer-including gate spacer 162, or the lower portion of the scavenging-island-including gate spacer 262 is performed after processing steps that employ an oxidizing ambient. The scavenging material within the scavenging-nanoparticle-including gate spacer 62, the lower portion of the scavenging-material-layer-including gate spacer 162, or the lower portion of the scavenging-island-including gate spacer 262, scavenges oxygen that diffuses toward the gate dielectric 50 during the processing steps that employ an oxidizing ambient, thereby prevention an additional oxidation of the gate dielectric 50 due to the diffusing oxygen atoms or molecules.

Figure 20:
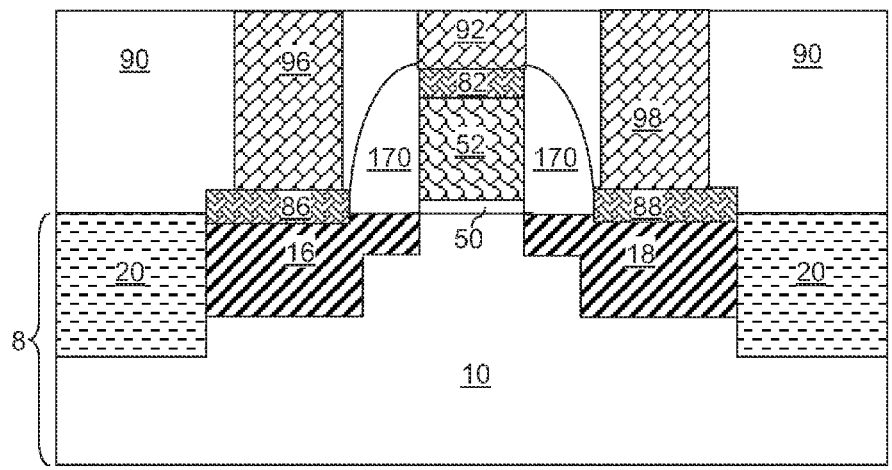
FIG. 20 is a vertical cross-sectional view of the fifth exemplary semiconductor structure after formation of a contact-level dielectric layer, metal-semiconductor alloy portions, and contact via structures according to the fourth embodiment of the present disclosure.

Referring to FIG. 20, once all processing steps employing an oxidizing ambient are completed, the scavenging-nanoparticle-including gate spacer 62, the lower portion of the scavenging-material-layer-including gate spacer 162, or the lower portion of the scavenging-island-including gate spacer 262 can be removed, and a new dielectric gate spacer 170 including an oxygen-impermeable material such as silicon nitride can be deposited. A contact-level dielectric layer 90, metal-semiconductor alloy portions (82, 86, 88), and contact via structures (92, 96, 98) can be formed as in the first through fourth embodiments.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
a gate stack comprising a gate dielectric and a gate electrode and located on a semiconductor substrate; and
an oxygen-scavenging-material-including gate spacer laterally surrounding said gate stack and contacting said semiconductor substrate and said gate electrode, and including:
an insulating matrix containing a contiguous stack of layers of a dielectric material that contacts sidewall surfaces of said gate dielectric, a top surface of said semiconductor substrate, and sidewall surfaces of said gate electrode, and not contacting a bottom surface of said gate electrode, and
multiple nanoparticles consisting of an elemental metal or an alloy of at least two elemental metals, wherein said multiple nanoparticles are embedded inside said insulating matrix as discrete nanoparticles, wherein an areal coverage of the nanoparticles is less than 10% of an area of an underlying layer of the dielectric material.

2. The semiconductor structure of claim 1, wherein said gate electrode is not electrically shorted to a semiconductor material located in said semiconductor substrate and contacting said gate dielectric.

3. The semiconductor structure of claim 1, wherein said gate dielectric comprises a dielectric metal oxide having a dielectric constant greater than 8.0.

4. The semiconductor structure of claim 1, wherein said nanoparticles comprise a Group IA element, a Group IIA element, a Group IIIA element, a Group IIIB element, a Group IVB element, a transition metal, or an alloy thereof.

5. The semiconductor structure of claim 1, further comprising:
a contact-level dielectric layer overlying said gate stack and said oxygen-scavenging-material-including gate spacer; and
a contact via structure laterally in contact with a sidewall of said oxygen-scavenging-material including gate spacer.

6. The semiconductor structure of claim 4, wherein said nanoparticles include elemental aluminum, elemental lanthanum, elemental titanium, or an alloy of at least two of elemental aluminum, elemental lanthanum, and elemental titanium.

7. The semiconductor structure of claim 1, wherein said nanoparticles within said oxygen-scavenging-material-including gate spacer does not contact a semiconductor material in said semiconductor substrate.

8. The semiconductor structure of claim 1, wherein said nanoparticles do not form a continuous layer and do not render said oxygen-scavenging-material-including gate spacer electrically conductive.

9. A semiconductor structure comprising:
a gate stack comprising a gate dielectric and a gate electrode and located on a semiconductor substrate; and
an oxygen-scavenging-material-including gate spacer laterally surrounding said gate stack and contacting said semiconductor substrate and said gate electrode and including:
an insulating matrix containing a contiguous stack of layers of a dielectric material that contacts sidewall surfaces of said gate dielectric, a top surface of said semiconductor substrate, and sidewall surfaces of said gate electrode, and not contacting a bottom surface of said gate electrode, and
multiple nanoparticles comprising at least one elemental metal, wherein said multiple nanoparticles are embedded inside said insulating matrix as disjoined multiple scavenging material islands, wherein an areal coverage of the scavenging material islands is from 20% to 80% of an underlying layer of the dielectric material.

10. The semiconductor structure of claim 9, wherein said nanoparticles consist of said at least one metal, and said nanoparticles have a maximum dimension less than 10 nanometers.

11. The semiconductor structure of claim 9, wherein said gate electrode is not electrically shorted to a semiconductor material located in said semiconductor substrate and contacting said gate dielectric.

12. The semiconductor structure of claim 9, wherein said nanoparticles comprise a Group IA element, a Group IIA element, a Group IIIA element, a Group IIIB element, a Group IVB element, a transition metal, or an alloy thereof.

13. The semiconductor structure of claim 9, wherein said scavenging material islands within said oxygen-scavenging-material-including gate spacer do not contact a semiconductor material in said semiconductor substrate.

14. The semiconductor structure of claim 3, wherein said dielectric material contained in said insulating matrix is silicon nitride.

15. The semiconductor structure of claim 1, wherein said dielectric material contained in said insulating matrix is different in composition from a dielectric material contained in said gate dielectric.

16. The semiconductor structure of claim 9, wherein said dielectric material contained in said insulating matrix is different in composition from a dielectric material contained in said gate dielectric.

17. The semiconductor structure of claim 1, wherein said nanoparticles are not present within any area underlying, and overlapping in area with, said gate electrode.

18. The semiconductor structure of claim 9, wherein said nanoparticles are not present within any area underlying, and overlapping in area with, said gate electrode.

* * * * *